(12) United States Patent
Kümmel et al.

(10) Patent No.: US 11,814,722 B2
(45) Date of Patent: Nov. 14, 2023

(54) VACUUM-COATING SYSTEM, AND METHOD FOR COATING A STRIP-TYPE MATERIAL

(71) Applicant: SMS group GmbH, Düsseldorf (DE)

(72) Inventors: Lutz Kümmel, Jüchen (DE); Thomas Daube, Duisburg (DE)

(73) Assignee: SMS group GmbH, Düsseldorf (DE)

( * ) Notice: Subject to any disclaimer, the term of this patent is extended or adjusted under 35 U.S.C. 154(b) by 428 days.

(21) Appl. No.: 17/059,227

(22) PCT Filed: May 28, 2019

(86) PCT No.: PCT/EP2019/063720
§ 371 (c)(1),
(2) Date: Nov. 26, 2020

(87) PCT Pub. No.: WO2019/229017
PCT Pub. Date: Dec. 5, 2019

(65) Prior Publication Data
US 2021/0207262 A1    Jul. 8, 2021

(30) Foreign Application Priority Data

May 28, 2018   (DE) .................. 10 2018 208 337.1
Sep. 5, 2018    (DE) .................. 10 2018 215 101.6

(51) Int. Cl.
*C23C 14/56*    (2006.01)
*C23C 14/02*    (2006.01)
(Continued)

(52) U.S. Cl.
CPC ............ *C23C 14/562* (2013.01); *B65H 35/02* (2013.01); *C23C 14/028* (2013.01); *C23C 14/06* (2013.01);
(Continued)

(58) Field of Classification Search
CPC ................ C23C 14/562; C23C 16/545; C23C 14/56–568; C23C 16/54–545;
(Continued)

(56) References Cited

U.S. PATENT DOCUMENTS 5,053,252 A * 10/1991 Kimura .................... G11B 7/26
                                                          118/725
5,514,217 A *  5/1996 Niino ..................... C23C 16/545
                                                          136/258
(Continued)

FOREIGN PATENT DOCUMENTS

CN          101466627 A        6/2009
CN          102892696 A        1/2013
(Continued)

*Primary Examiner* — Aiden Lee
(74) *Attorney, Agent, or Firm* — Smartpat PLC

(57) ABSTRACT

A method and a vacuum-coating system (10) for coating a strip-shaped material (11), in particular made of metal, are disclosed. Thereby, the strip-shaped material (11) is moved over a conveying section (12) in a transport direction (T) and vacuum-coated within a coating chamber (14) in which a vacuum is applied. When viewed in the transport direction (T) of the strip-shaped material (11), at least one trimming shear (38) is arranged upstream of the coating chamber (14), with which the strip-shaped material (11) is trimmed at at least one strip edge, preferably at both strip edges, in order to produce a constant width for the strip-shaped material (11) over its longitudinal extension.

9 Claims, 2 Drawing Sheets

(51) Int. Cl.
  *B65H 35/02*   (2006.01)
  *C23C 14/06*   (2006.01)
  *C23C 16/54*   (2006.01)

(52) U.S. Cl.
  CPC .... *C23C 16/545* (2013.01); *B65H 2301/5114* (2013.01); *B65H 2301/5155* (2013.01); *B65H 2511/12* (2013.01)

(58) Field of Classification Search
  CPC .......... C23C 14/028; B65H 2301/5114; B65H 23/0204; B65H 23/0324
  USPC .................................................. 118/718, 179
  See application file for complete search history.

(56) References Cited

U.S. PATENT DOCUMENTS

| | | | |
|---|---|---|---|
| 5,919,517 A * | 7/1999 | Levendusky | B05D 3/02 |
| | | | 427/178 |
| 6,334,751 B1 | 1/2002 | Brande et al. | |
| 2005/0268762 A1 * | 12/2005 | Hein | C23C 14/562 |
| | | | 83/13 |
| 2007/0163494 A1 * | 7/2007 | Tokie | C23C 14/042 |
| | | | 118/301 |
| 2009/0258476 A1 * | 10/2009 | Britt | H01L 31/03928 |
| | | | 438/479 |
| 2010/0088967 A1 | 4/2010 | Kümmel et al. | |
| 2011/0241239 A1 | 10/2011 | Mahnad | |
| 2013/0064978 A1 * | 3/2013 | Kim | B65H 18/103 |
| | | | 242/525 |
| 2016/0045934 A1 | 2/2016 | Hoffmann et al. | |
| 2019/0085445 A1 | 3/2019 | Jaenecke | |

FOREIGN PATENT DOCUMENTS

| | | |
|---|---|---|
| CN | 204194919 U | 3/2015 |
| CN | 204588263 U | 8/2015 |
| DE | 3035000 A1 | 3/1982 |
| DE | 19527515 C1 | 11/1996 |
| DE | 19735603 C1 | 11/1998 |
| DE | 102009053367 A1 | 5/2011 |
| DE | 102016223743 A1 | 11/2017 |
| EP | 1004369 B2 | 11/2008 |
| JP | 2008031505 A | 2/2008 |
| WO | 2008049523 A1 | 5/2008 |
| WO | 2012034587 A1 | 3/2012 |
| WO | 2012143112 A1 | 10/2012 |

* cited by examiner

VACUUM-COATING SYSTEM, AND METHOD FOR COATING A STRIP-TYPE MATERIAL

TECHNICAL FIELD

The disclosure relates to a vacuum-coating system for coating a strip-shaped material, and to a method for coating a strip-shaped material.

BACKGROUND

In the production of strip steel both hot rolling and cold rolling cause the width of the strip to change along its length. This is caused by the so-called "widening," which results in an increase in width of the rolled strip of several millimeters due to the rolling pass. As a rule, the varying widening over the length of the steel strip is due to tension variations within the system with which the steel strip is processed.

A further problem in the rolling of steel strips is that the rolling process can cause edge or center waves due to different elongation over the cross-section.

In the production of strip-shaped material, for example in the form of steel strips, galvanizing the surfaces of such strip-shaped material is known from the prior art. This can take place by means of a vacuum evaporation process, as known from DE 30 35 000 A1, DE 195 27 515 C1 or DE 197 35 603 C1. This vacuum evaporation process also includes the so-called "PVD technology," which is explained, for example, in DE 10 2009 053 367 A1.

With the abovementioned vacuum evaporation process the coating of the strip material takes place in vacuum, wherein the strip material is fed through an airlock and/or a system of aperture elements into a chamber or the like, in which vacuum exists or is generated. As a rule, the sealing of the vacuum generated in the chamber against the environment takes place by means of sealants in the form of aperture elements, which is described in, for example, WO 2008/049523 A1 in connection with a strip airlock. In accordance with EP 1 004 369 B1, such a seal can also be realized by an airlock with a plurality of rollers, wherein at least one roller is offset in relation to at least two other rollers and can be adjusted with its distance to such two other rollers, in order to achieve a seal for the strip-shaped material that is moved between such rollers.

JP 2008 031 505 A discloses passing a strip-shaped material with its width extension in vertical orientation through a vacuum coating chamber. By pivoting rollers around which the strip-shaped material is guided for movement in a transport direction, it is achieved that the strip-shaped material experiences an obliquely upward force to prevent sagging as a result of its weight and prevent the formation of wrinkles.

If a strip-shaped material is coated according to the principle of the vacuum evaporation process, the sealing of the vacuum from the environment is of great importance. For this purpose, the vacuum chamber, in which the coating of the strip-shaped material is realized, has airlocks on the inlet side and outlet side. During the transport of the strip material through the vacuum chamber, lateral gaps arise between the inner walls of the airlocks and the outer strip edges of the strip material. To minimize such gaps, it is important to know the exact width of the strip material over its length. If the strip-shaped material shows an uneven width over its length, this can lead to either increased wear or even to a collapse of the vacuum in the area of the airlocks of the vacuum chamber, which interferes with the coating process under vacuum.

DE 10 2016 223 743 A1 shows a vacuum coating system and an associated method of coating a strip.

SUMMARY

Accordingly, the disclosure is based on the object of optimizing the coating of strip-shaped material under vacuum by simple means and achieving improved process reliability. This object is achieved by a vacuum-coating system as claimed and by a method as claimed.

A vacuum-coating system serves for coating a strip-shaped material, in particular made of metal, and comprises a conveying section with transport means, in particular in the form of rollers, on which the strip-shaped material with its width being arranged horizontally can be moved in a transport direction, and a coating chamber in which vacuum can be generated. The coating chamber has an inlet area and an outlet area, through which the strip material can pass through the coating chamber on the conveying section along or in the transport direction. When viewed in the conveying direction of the strip-shaped material, at least one trimming shear is arranged upstream of the coating chamber, wherein the strip-shaped material is trimmed by means of such trimming shear at at least one strip edge, preferably at both strip edges, in order to produce a constant width for the strip-shaped material over its longitudinal extension. Seen in the direction of transport of the strip-shaped material, a strip position control device is arranged upstream of the trimming shear, with which the strip-shaped material can be aligned with respect to the center of the conveying path.

In the same manner, a method for coating a strip-shaped material, in particular made of metal, is provided with which the strip-shaped material with its width-extension being horizontally arranged is moved over a conveying section in a transport direction and is vacuum-coated within a coating chamber in which a vacuum is applied. Thereby, when viewed in the transport direction of the strip-shaped material, the strip-shaped material is trimmed or cut at at least one strip edge, preferably at both strip edges, upstream of the coating chamber, in order to produce a constant width for the strip-shaped material over its longitudinal extension. Seen in the direction of transport of the strip-shaped material, a strip position control device is arranged upstream of the trimming shear, with which the strip-shaped material can be aligned with respect to the center of the conveying section. The strip-shaped material is aligned with respect to the center of the conveying section by a strip position control device which—seen in the transport direction of the strip-shaped material—is arranged upstream of the trimming shear.

The disclosure is based on the finding that a strip-shaped material is beneficially trimmed before it enters the vacuum-set coating chamber of a vacuum-coating system in order to achieve a constant width of the strip-shaped material over its length. If the strip material has an uneven width along its length, for example due to widening, this can be compensated by trimming, which is performed before or upstream of the inlet area of the coating chamber. Trimming takes place either at one of the two strip edges or lateral edges of the strip-shaped material, or—depending on the width deviation—at both strip edges thereof.

The installation of at least one trimming shear before or upstream of the inlet area of the coating chamber of the vacuum-coating system, with which—as required—a corresponding trimming of the strip-shaped material is carried out, leads to the advantage that a strip width suitable for the end product and optimal for the subsequent coating process, which is realized within the coating chamber, is adjusted. In particular, this trimming of the strip-shaped material achieves a predetermined width for this purpose, which corresponds exactly to the width of the inlet airlock and outlet airlock.

An additional advantage of trimming the strip edges of the strip material upstream of the inlet side of the coating chamber is that the (trimmed) strip edges of the strip material are also coated, for example galvanized, during the subsequent coating process under vacuum.

In an advantageous additional embodiment, at least one position sensor is provided, with which a position of the strip-shaped material on the conveying section can be determined in an area—when viewed in the transport direction of the strip-shaped material—upstream of the coating chamber. Expediently, the vacuum-coating system is also equipped with a control device, by means of which the trimming shear can be actuated or controlled as a function of the signals of the position sensor. This means that the trimming shear is only activated in case the position sensor detects that the width of the strip material deviates from a predetermined value and therefore trimming by means of the trimming shear is necessary. As already explained, such trimming can take place either at one side edge or at one strip edge of the strip material only, or on both sides, that is, on both strip edges (that is, left and right).

Further deviations of the strip-shaped material from predetermined target values can be caused by flatness errors, which occur, for example, in upstream heat treatment processes in the heating area and the cooling zone. In addition, edge or center waves can be caused by the rolling process due to varying elongation over the cross-section, which also leads to flatness errors. Such flatness errors can lead to problems in the area of the airlocks of the coating chamber, which can lead to increased leakage or even to the collapse of the vacuum.

By providing—when viewed in the transport direction of the strip-shaped material—a strip position control device which is preferably arranged immediately upstream of the trimming shear, and with which the strip-shaped material can be aligned with respect to the center of the conveying section it is ensured that the strip-shaped material always enters the active area or the cutting blades of the trimming shear uniformly with respect to its lateral edges, such that a constant width over the length of the strip-shaped material is achieved by trimming it. The positioning of the strip position control device directly in front of the trimming shear also has the effect that the strip-shaped material, after it has passed such strip position control device, then runs directly into the active area of the trimming shear and thus cannot run further on the conveying section, in the area upstream or in front of the trimming shear, transversely or perpendicularly to the transport direction.

For compensation of the aforementioned flatness defects, an advantageous additional embodiment provides that—when viewed in the transport direction of the strip-shaped material—at least one skin pass mill and/or a stretching/bending device is arranged upstream of the at least one trimming shear, through which the strip-shaped material is passed, in order to produce a desired flatness for the strip-shaped material. This makes it possible that the strip-shaped material, before it enters the coating chamber through the inlet airlock, is given a desired flatness, which is in particular adapted to the design of sealing elements of the inlet airlock.

Optionally, it can be provided that a required surface roughness is also set for the strip-shaped material by means of the skin pass mill before it then runs into the vacuum-coating chamber for application of the coating.

The present disclosure is advantageous for the coating of strip material under vacuum, which consists of steel strip and has a microstructure content of at least 10% martensite. Such a steel strip can further contain 0.1-0.4% carbon, 0.5-2.0% silicon and/or 1.5-3.0% manganese. Such steels can be "dual phase steels" (DP), "complex phase steels" (CP), "quenching and partitioning steels" (Q&P) or "martensitic steels" (MS), each with a different content of martensite (with at least 10%).

A preferred embodiment of the disclosure is described in detail below, using a schematically simplified drawing.

DETAILED DESCRIPTION

Figure 1:
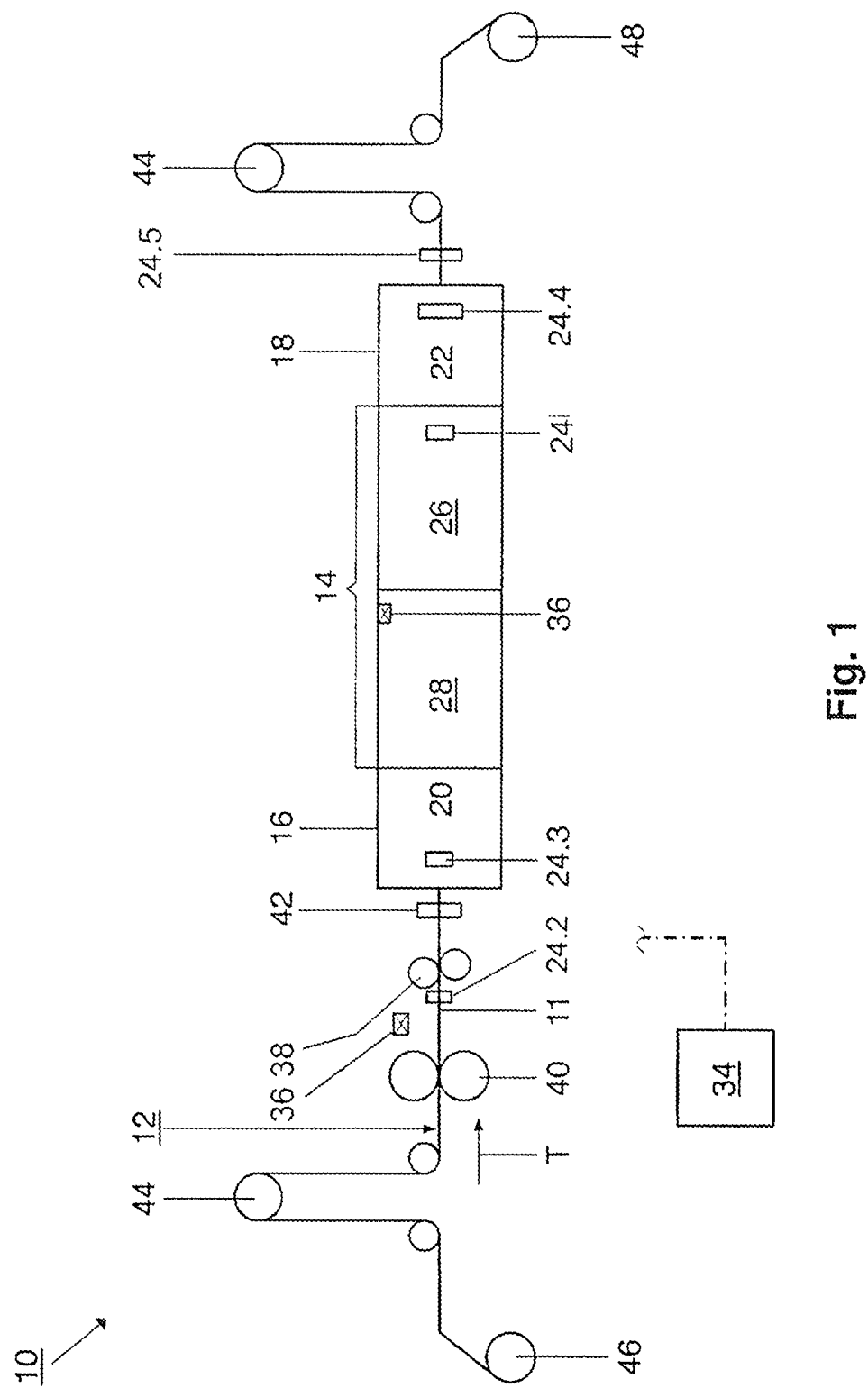
FIG. 1 shows a schematically simplified side view of a system for coating a strip-shaped material, which can also be used to carry out a method for coating a strip-shaped material.

The present disclosure provides for a vacuum-coating system 10, with which a strip-shaped material 11 can be provided with a coating at at least one side thereof, preferably on both sides (top side and bottom side). Accordingly, such a vacuum-coating system 10 can also be used to carry out a method in order to coat the strip-shaped material 11. Identical features in the two figures of the drawing are each provided with identical reference signs. At this point, it is pointed out that the drawing is only simplified and, in particular, is shown without scale.

The strip-shaped material 11 can be made of metal, in particular steel or stainless steel or corresponding alloys thereof. Furthermore, it is pointed out that the strip-shaped material 11, which is coated with the vacuum coating machine 10, can be hot-rolled or cold-rolled strip.

In the following, the vacuum-coating system 10, the individual components thereof and their mode of operation are explained in detail:

The vacuum-coating system 10 comprises a conveying section 12 with transport means (not shown), for example in the form of rollers, on which the strip-shaped material is moved in a transport direction T. Thereby, the strip-shaped material 11 is unwound at the inlet of the conveying section 12 by a first coiling device 46, wherein the strip-shaped material 11—after the desired coating has been carried out or completed—is rewound at the outlet of the conveying section 12 by a second coiling device 48. Directly after the first coiling device 46 and before the second coiling device 48, (strip) accumulators 44 can be provided, with or in which the strip-shaped material 11 can be stored. Within the conveying section 12, the strip-shaped material 11 is moved or transported in the direction of movement T, specifically from the first coiling device 46 in the direction of the second coiling device 48.

A coating chamber 14 is arranged along the conveying section 12, through which the strip-shaped material 11 is moved. For this purpose, the coating chamber 14 has an inlet area 16 and an outlet area 18, wherein an inlet airlock 20 is provided in the inlet area 16 and an outlet airlock 22 is provided in the outlet area 18. A vacuum is generated in the coating chamber 14. Thereby, the inlet airlock 20 and the outlet airlock 22 ensure a suitable sealing of such vacuum against the external environment, with simultaneous movement of the strip-shaped material 11 along the conveying section 12 or through such two airlocks 20, 22.

The coating chamber 14 has a multipart design and has a coating part 26 and a cleaning part 28. Both of such parts 26 and 28 are—as explained above—placed under vacuum. In the coating part 26, the actual coating of the strip-shaped material 11 is performed, for example according to the principle of "PVD" (=physical vapor deposition), either on one side of the strip-shaped material or on both sides thereof.

At least one strip position control device 24 can be arranged within the coating chamber 14, for example within the coating part 26, as shown in FIG. 1. In addition or as an alternative, it is possible to install such a strip position control device 24 in the cleaning part 28.

The vacuum-coating system 10 comprises a control device (shown in FIG. 1 only simplified by a block symbol with the reference sign "34"), which is in signal connection (wired, or wireless, for example, via a radio link or the like) with at least one position sensor 36. Such position sensor 36 can be arranged in the coating chamber 14 for the purpose of determining the position of the strip material 11 on the conveying section 12, in particular with respect to its center area.

By means of a strip position control device 24, it is possible to adjust or align a position of the strip shaped material 11 in relation to a center of the conveying section 12. This takes place by detecting a position of the strip-shaped material 11 on the conveying section 12 by the position sensor 36 within the coating chamber 14, wherein subsequently—if necessary—actuators (not shown) of the strip position control device 24 are activated by the control device 34 in order to align the strip-shaped material 11 in relation to the center of the conveying section 12 and perpendicular to the transport direction T. The actuators of the strip position control device 24 can be contact rollers that are laterally adjusted to the edges of the strip material 11. In addition and/or alternatively, such actuators can be designed in the form of control rollers, over which the strip-shaped material 11 is moved along the transport direction T and with which the strip-shaped material 11 encloses a wrap angle. With such control rollers, the alignment of the strip-shaped material 11 with respect to the center of the conveying section 12 is then either performed by adjusting a control roller with its longitudinal axis perpendicular to the conveying direction (proportionally acting control roller), or by rotating a control roller with its longitudinal axis relative to the conveying direction (integrally acting control roller). Correspondingly, the strip-shaped material 11 can always be optimally positioned within the vacuum-set coating chamber 14, such that, for example, a "cornering" or a contact of the strip-shaped material 11 with side walls of the coating chamber 14 or the coating part 26 during a movement of the strip-shaped material 11 along the conveying section 12 is prevented.

Furthermore, it can be provided that additional strip position control devices 24.3, 24.4 are arranged within the inlet airlock 20 and/or within the outlet airlock 22. It is also possible that an additional strip position control device 24.2—when viewed in the transport direction T of the strip-shaped material 11—is arranged upstream of the inlet airlock 20, and/or that an additional strip position control device 24.5—when viewed in the transport direction T of the strip-shaped material 11—is arranged downstream of the outlet airlock 22. In this respect, it may be pointed out that all of such strip position control devices can have actuators, as explained above, in order to align the strip material 11 with respect to the center of the conveying section 12 and perpendicular to the conveying direction T.

When viewed in the transport direction T of the strip-shaped material 11, an additional chemical cleaning device 42 can be arranged upstream of the inlet airlock 20, through which the strip-shaped material 11 passes before entering the coating chamber 14. Thereby, the surfaces of the strip material 11 are preliminarily cleaned or purified before it is subjected to fine cleaning in the cleaning section 28 (under vacuum).

The vacuum-coating system 10 comprises at least one trimming shear 38, which—when viewed in the transport direction T of the strip-shaped material 11—is arranged upstream of the inlet airlock 20. Adjacent to this, at least one additional position sensor 36 is provided, with which a position of the strip-shaped material 11 on the conveying section 12 can be determined in an area upstream of the coating chamber 14, and thus also in the area of the trimming shear 38. Such position sensor 36 is also connected to the control device 34 by means of signal technology. Accordingly, the control device 34 allows the trimming shear 38 to be actuated or set in action as a function of the signals of the position sensor 36.

The signal connection between the control device 34, on the one hand, and the position sensors 36, the strip position control devices 24 and the trimming shear 38, on the other hand, is symbolized by a slash-dotted line in FIG. 1.

The trimming shear 38 is used to trim the strip-shaped material 11 at either one strip edge thereof, or optionally at both strip edges (that is, at the left and right side edges of the strip-shaped material 11), that is, to make it narrower there by means of cutting, thus reducing the width of the strip-shaped material 11 perpendicular to the transport direction T. The trimming shear 38 is actuated during the operation of the vacuum-coating system 10 and during a corresponding movement of the strip-shaped material 11 along the conveying section 12 if the position sensor 36 detects that a width of the strip-shaped material 11 deviates from a predetermined target value and is too large, for example due to a widening. Trimming ensures that the strip-shaped material 11 in the area upstream of the inlet airlock 20, and thus before entering the coating chamber 14, has a constant width over its length, wherein such width is also optimally adapted to the width of the inlet airlock 20.

Figure 2:
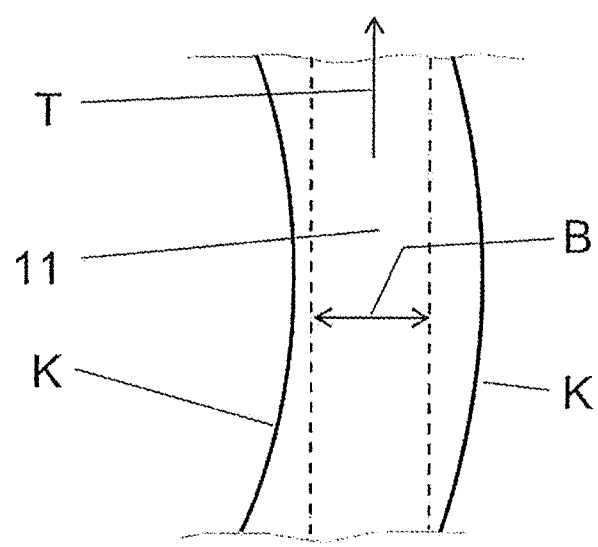
FIG. 2 shows a top view of a strip-shaped material, which is trimmed at its strip edges.

FIG. 2 shows a top view of the strip-shaped material 11, wherein the transport direction is also illustrated with "T," but for purposes of simplification, the other components of the vacuum-coating system 10 are not shown. In the illustration of FIG. 2, the strip material 11 has—shown in exaggerated form—a saber shape and does not have a constant width in its transport direction T.

In FIG. 2, dashed lines symbolize the cut edges at which the strip material 11 is trimmed, that is, cut, at its two strip edges K by means of the trimming shear 38. As a result, a constant width B over the longitudinal extension of the strip material 11 is achieved, with which the strip material 11 then enters the coating chamber 14 in the transport direction T, specifically, as explained, through the inlet airlock 20.

Further possible flatness defects of the strip-shaped material 11 can be balanced or compensated by a skin pass mill 40 and/or by a stretching/bending device (not shown), which—when viewed in the transport direction T of the strip-shaped material 11—is/are arranged upstream of the trimming shear 38.

By passing the strip-shaped material 11 through the coating chamber 14, a coating is applied at least to one surface of the strip-shaped material 11, preferably to both surfaces thereof, for example a zinc layer. Such coating can be applied within the coating section 26 according to the PVD principle. After at least one surface of the strip-shaped material 11 has been provided with a coating, for example a zinc layer, the strip-shaped material 11 is then rewound, as explained, by the second coiling device 12.

With regard to the operation of the trimming shear 38, it may be noted that, according to one embodiment, it is possible to operate such trimming shear 38 as a function of the signals of the position sensor 36, which is arranged upstream of such trimming shear 38, only if a deviation of the position and/or the width of the strip-shaped material 11 from a predetermined value is detected, in particular with respect to a center of the conveying section 12.

According to an additional embodiment, and in correspondence with the illustration in FIG. 2, it is provided that—when viewed in the transport direction T of the strip-shaped material 11—a strip position control device 24.2 is arranged upstream of the trimming shear 38, with which the strip-shaped material 11 can be aligned with respect to the center of the conveying section 12. The positioning of such strip position control device 24.2 is carried out directly upstream of the trimming shear 38. This means, that a distance of the strip position control device 24.2 to the trimming shear, as explained in the conveying direction T of the strip-shaped material 11 seen upstream thereof, is selected to be very small, and in particular no additional units or the like are provided between the strip position control device 24.2 and the trimming shear 38. In this respect, it is understood that the strip position control device 24.2 is connected to the position sensor 36, which—when viewed in the transport direction T of the strip-shaped material 11—is also arranged upstream of the trimming shear 38 by means of signal technology. Accordingly, the strip-shaped material 11 can be aligned with respect to a center of the conveying section 12 in an area on the conveying section 12, immediately before it enters the effective area of the trimming shear 38, by means of the strip position control device 24.2 arranged there. In this manner, the specified strip position control device 24.2 fulfills the function of a strip center control unit.

In addition and/or alternatively to this, according to an additional embodiment (not shown), it is possible to extend or retract the trimming shear 38 laterally into the conveying section 12 perpendicular to the transport direction T, as required.

Thus, the present disclosure enables the application of a coating to a surface(s) of the strip-shaped material 11 at only low temperatures, without changing or impairing the material properties of the strip-shaped material 11. This is particularly advantageous if the strip-shaped material is a steel strip, in particular in the form of hot-rolled strip, which has a microstructure of at least 10% martensite.

LIST OF REFERENCE SIGNS

10 Vacuum-coating system
11 Strip-type material
12 Conveying section
14 Coating chamber
16 Inlet area
18 Outlet area
20 Inlet airlock
22 Outlet airlock
24 Strip position control device
24.2 Strip position control device
24.3 Strip position control device
24.4 Strip position control device
26 Coating part
28 Cleaning part
34 Control device
36 Position sensor
38 Trimming shear
40 Skin pass mill
42 Chemical cleaning device
44 Accumulator
46 First coiling device (inlet)
48 Second coiling device (outlet)
B Constant width (of the strip-type material 11)
K Strip edge(s) (of the strip-type material 11)
T Transport direction (for the strip-type material 11)

The invention claimed is:

1. A vacuum-coating system for coating a strip-shaped metal material, comprising:
a conveying section with transport rollers, on which the strip-shaped metal material moves in a transport direction, the transport rollers being configured to convey the strip-shaped metal material with a width of the strip being horizontally arranged;
a coating chamber in which a vacuum is generated, the coating chamber having an inlet area with an inlet air lock and an outlet area with an outlet air lock through which the strip-shaped metal material passes in the transport direction from an environment into and out of the vacuum; and
a trimming shear arranged in the environment upstream of the coating chamber, the trimming shear being configured to trim the strip-shaped metal material at at least one strip edge to produce a constant width of the strip-shaped metal material corresponding to a width of the inlet air lock and the outlet air lock; and
a strip position control device arranged upstream of the trimming shear, the strip position control device being configured to align the strip-shaped metal material with respect to a center of the conveying section.

2. The vacuum-coating system according to claim 1, further comprising a position sensor with which a position of the strip-shaped metal material on the conveying section is determined in an area upstream of the coating chamber.

3. The vacuum-coating system according to claim 2, further comprising a control device, by which the trimming shear is actuated as a function of signals of the position sensor.

4. The vacuum-coating system according to claim 1, wherein the trimming shear is configured to trim the strip-shaped metal material at both strip edges.

5. The vacuum-coating system according to claim 1, further comprising a skin pass mill and/or a stretching/bending device arranged upstream of the trimming shear, through which the strip-shaped metal material is passed in order to produce a desired flatness for the strip-shaped metal material.

6. The vacuum-coating system according to claim 1, further comprising a skin pass mill arranged upstream of the trimming shear.

7. The vacuum-coating system according to claim 6, wherein a width of the strip upstream of the trimming shear is wider than the width of the inlet air lock.

8. The vacuum-coating system according to claim 7, further comprising a first coiling device configured to unwind a coil of the strip-shaped metal material at an inlet of the conveying section, and a second coiling device configured to rewind the strip-shaped metal after it has been coated.

9. A system for galvanizing a steel strip, comprising:

a first coiling device arranged at an inlet of the system, the first coiling device being configured to unwind the steel strip from a coil;

a skin pass mill arranged downstream of the first coiling device, the skin pass mill being configured to balance or compensate flatness defects of the steel strip;

a trimming shear arranged downstream of the skin pass mill, the trimming shear being configured to cut off a left strip edge and a right strip edge of the steel strip such that the steel strip has a constant width downstream of the trimming shear;

a coating chamber in which a vacuum is generated arranged downstream of the trimming shear, the coating chamber having an inlet area with an inlet air lock through which the steel strip passes from an environment into the vacuum, and an outlet area with an outlet air lock through which the steel strip passes from the vacuum into the environment, the coating chamber being configured to apply a zinc layer to the steel strip by physical vapor deposition; and a second coiling device arranged downstream of the coating chamber for rewinding the coated steel strip into a coil.

\* \* \* \* \*